United States Patent
Oyama et al.

(10) Patent No.: US 10,996,661 B2
(45) Date of Patent: May 4, 2021

(54) MANUFACTURING MANAGEMENT DEVICE

(71) Applicant: FUJI CORPORATION, Chiryu (JP)

(72) Inventors: Shigeto Oyama, Kariya (JP); Jun Iisaka, Nisshin (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/476,964

(22) PCT Filed: Jan. 13, 2017

(86) PCT No.: PCT/JP2017/001029
§ 371 (c)(1),
(2) Date: Jul. 10, 2019

(87) PCT Pub. No.: WO2018/131136
PCT Pub. Date: Jul. 19, 2018

(65) Prior Publication Data
US 2019/0354090 A1    Nov. 21, 2019

(51) Int. Cl.
*G05B 19/418*    (2006.01)

(52) U.S. Cl.
CPC ............ *G05B 19/4189* (2013.01); *G05B 2219/45026* (2013.01); *G05B 2219/45054* (2013.01)

(58) Field of Classification Search
CPC ...... G05B 19/4189; G05B 2219/45026; G05B 2219/45054
See application file for complete search history.

(56) References Cited

U.S. PATENT DOCUMENTS

| | | | |
|---|---|---|---|
| 5,584,118 A | | 12/1996 | Furukawa et al. |
| 5,696,689 A | * | 12/1997 | Okumura ........... G05B 19/4189 700/121 |
| 7,036,213 B2 | * | 5/2006 | Kabeshita .......... H05K 13/0061 29/740 |
| 7,142,939 B2 | * | 11/2006 | Nonaka ................. G06Q 10/10 700/121 |

(Continued)

FOREIGN PATENT DOCUMENTS

| | | | |
|---|---|---|---|
| JP | 4-348853 A | | 12/1992 |
| JP | H08126942 A | * | 5/1996 |

(Continued)

OTHER PUBLICATIONS

Oyama Shigeto, Production management device for substrate production line, Aug. 2015, WIPO, pp. 2-8.*

(Continued)

*Primary Examiner* — Rocio Del Mar Perez-Velez
*Assistant Examiner* — Yvonne Trang Follansbee
(74) *Attorney, Agent, or Firm* — Oblon, McClelland, Maier & Neustadt, L.L.P.

(57) ABSTRACT

A manufacturing management device includes a determination section configured to determine the necessity of maintenance on any of the multiple production devices during production by the production line; and a conveyance management section configured to stop loading circuit boards, at a predetermined time, onto a reference device among the multiple production devices when it is determined that maintenance is necessary, the reference device being positioned upstream in the production line from a maintenance target device having a cause for maintenance.

17 Claims, 4 Drawing Sheets

(56) References Cited

U.S. PATENT DOCUMENTS

| | | | |
|---|---|---|---|
| 8,442,666 B2 * | 5/2013 | Suginishi | G05B 19/41865 |
| | | | 700/101 |
| 9,696,711 B2 * | 7/2017 | Asakawa | G05B 19/402 |
| 2001/0020194 A1 * | 9/2001 | Takagi | G01N 21/94 |
| | | | 700/109 |
| 2005/0033463 A1 | 2/2005 | Tel et al. | |
| 2015/0301523 A1 * | 10/2015 | Fukao | G05B 19/4189 |
| | | | 700/112 |
| 2018/0327191 A1 * | 11/2018 | Nagatani | B65G 43/00 |

FOREIGN PATENT DOCUMENTS

| | | | |
|---|---|---|---|
| JP | 10-254536 A | | 9/1998 |
| JP | 2005167220 A | * | 6/2005 |
| JP | 2005267183 A | * | 9/2005 |
| JP | 2012-209300 A | | 10/2012 |
| JP | 2012-227407 A | | 11/2012 |
| JP | 5077446 B2 | * | 11/2012 |
| JP | 2014-135425 A | | 7/2014 |
| WO | WO-2015121918 A1 | * | 8/2015 ............. H05K 13/08 |

OTHER PUBLICATIONS

Nakada, Tomohito, Production scheduling apparatus, google patents translation (Year: 2005).*
Yokomori, Tadashi, Operation analyzer, operation analyzing system, operation analyzing program and method for analyzing operation, 2005, google patents translation (Year: 2005).*
Hidenori Ichimoto, Production line operation management method and device thereof, 1996, google patents translation (Year: 1996).*
Shiro Sugihara, Production line management device, production line management device control method, program, and recording medium, 2012, google patents translation (Year: 2012).*
International Search Report dated Apr. 11, 2017 in PCT/JP2017/001029 filed Jan. 13, 2017.

* cited by examiner

MANUFACTURING MANAGEMENT DEVICE

TECHNICAL FIELD

The present application relates to a manufacturing management device

BACKGROUND ART

Manufacturing management devices are applied in production lines for producing board products. As disclosed in Patent Literature 1, a production line is configured by installing multiple production devices such as solder printers, component mounters, appearance inspection devices, and reflow furnaces in the conveyance direction of a circuit board. In such a production line, a component mounter is stopped when an error requiring maintenance is detected in the component mounter. Accordingly, production devices upstream and downstream from the component mounter are subsequently stopped by the stagnation of circuit board conveyance. In a case where the production line has a buffer device capable of holding multiple circuit boards during production, the stagnation of circuit board conveyance can be mitigated to some extent.

PATENT LITERATURE

Patent Literature 1: JP-A-2012-227407

BRIEF SUMMARY

Technical Problem

However, depending on the type of the error detected, the required time for maintenance may become long causing the required time for the production process to greatly exceed the scheduled production time. In such cases, when the time required for the production process exceeds a time limit set to prevent deterioration of circuit board quality during production, the circuit board relating to the production process may become a target for removal. In this case, when multiple circuit boards are held in the buffer device positioned upstream from the production device requiring maintenance, the number of circuit board removals may increase.

It is an object of the present specification to provide a manufacturing management device capable of reducing the number of removed circuit boards during production even when an error or the like requiring maintenance occurs during production by the production line.

Solution to Problem

The present specification applies to a production line configured by installing multiple production devices, each including a component mounter configured to mount an electronic component on a circuit board, in the conveyance direction of the circuit board. The present disclosure discloses a manufacturing management device including: a determination section configured to determine the necessity of maintenance on any of the multiple production devices during production by the production line; and a conveyance management section configured to stop loading circuit boards, at a predetermined time, onto a reference device among the multiple production devices when it is determined that maintenance is necessary, the reference device being positioned upstream in the production line from a maintenance target device having a cause for maintenance.

Advantageous Effect

With the above-described manufacturing management device, when it is determined that maintenance is necessary in the production line, loading of circuit boards onto the reference device positioned upstream from the maintenance target device is stopped. As a result, the number of circuit boards held between the reference device and the maintenance target device can be reduced in comparison with a configuration in which loading of circuit boards to the reference device is stopped due to, for example, stagnation of circuit board conveyance accompanying the stopping of the maintenance target device. As a result, the number of removed circuit boards during production can be reduced.

DESCRIPTION OF EMBODIMENTS

1. Embodiment 1-1. Configuration of Production Line 1

Figure 1:
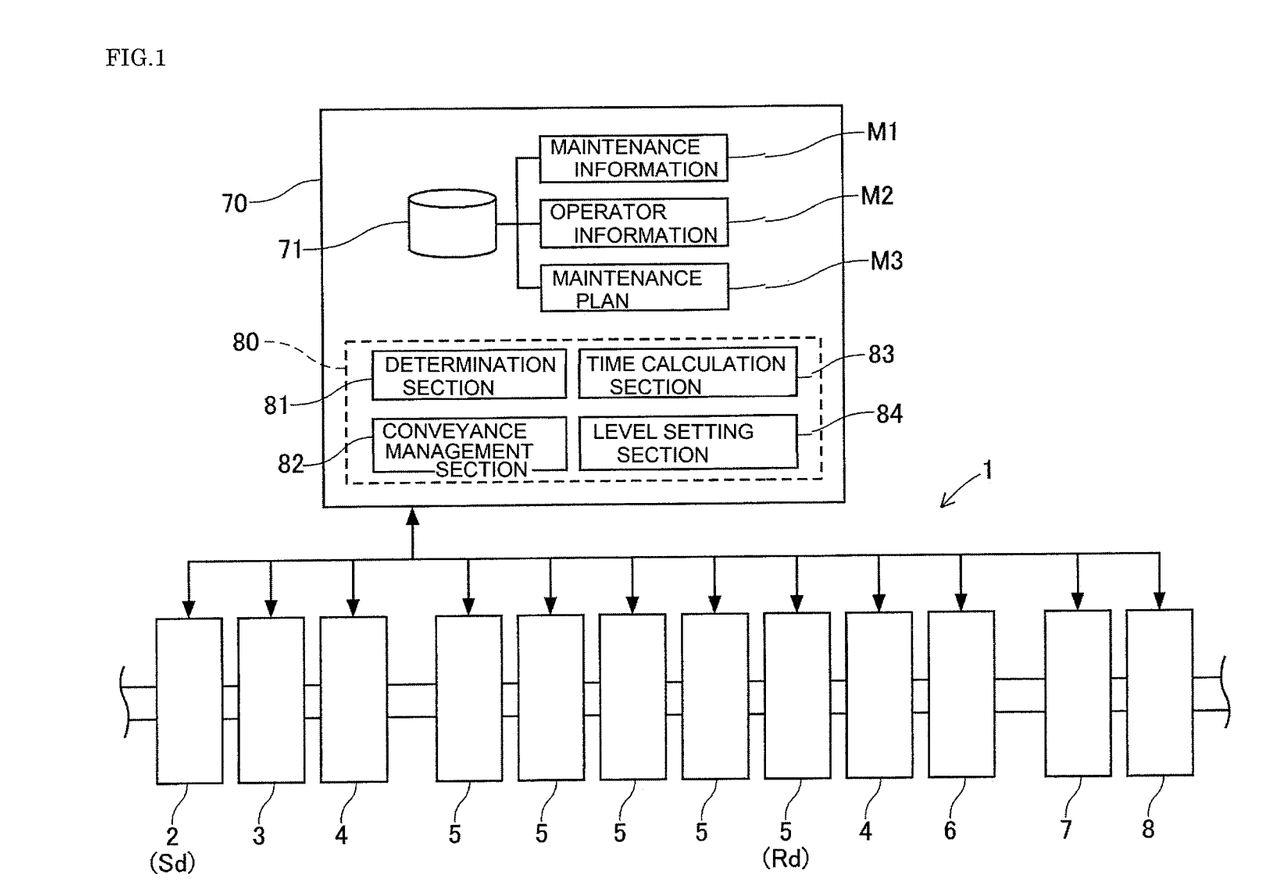
FIG. 1 is a plan view schematically showing a production line in an embodiment.

A manufacturing management device is applied to a production line for producing various board products. Hereinafter, the "circuit board" is simply referred to as a "board" and an electronic component is simply referred to as a "component". As shown in FIG. 1, production line 1 is configured by installing multiple production devices in the conveyance direction (right and left direction in FIGS. 1 and 2) of board 90. The above-described production devices include, in order from the upstream side of production line 1, printer 2, print inspection device 3, first buffer device 4, multiple component mounters 5, second buffer device 4, appearance inspection device 6, reflow furnace 7, and function inspection device 8.

In the production process of production line 1, board 90 is loaded onto printer 2 positioned at the head of production line 1. Board 90 is then conveyed downstream by the board conveyance device of each production device (for example, board conveyance device 10 of component mounter 5 shown in FIG. 2) and is unloaded from function inspection device 8 positioned at the end of production line 1. In addition, the production devices are connected communicably to each other and to host computer 70 (hereinafter referred to as "host PC"). The board conveyance devices of the respective production devices are controlled so as to operate in coordination with each other to prevent collisions of boards 90 between adjacent production devices.

Printer 2 prints solder in the form of a paste at a mounting position of the component on loaded board 90. In the present embodiment, the solder printed on board 90 by printer 2 has a predetermined viscosity and functions as a bonding material for bonding board 90 and the component to be mounted. Print inspection device 3 inspects the print state of board 90 on which solder has been printed by printer 2.

First and second buffer devices 4 are configured to hold a regulated number of boards 90 in production line 1. Buffer device 4 holds boards 90 unloaded from production devices upstream until production devices downstream are able to load held boards 90. Specifically, first buffer device 4 holds boards 90, on which the inspection process by print inspection device 3 has been completed, until board conveyance device 10 of component mounter 5 on the downstream side permits loading of held boards 90. In this case, first buffer device 4 can receive boards 90 unloaded from print inspection device 3 until the regulated number of boards is reached. In this manner, buffer device 4 functions to absorb the difference in cycle times between the upstream side and the downstream side, and functions such that the overall production process is executed smoothly.

Each of multiple component mounters 5 mounts a component on the solder of board 90 conveyed from the upstream side of production line 1. The configuration of component mounter 5 will be described below. Appearance inspection device 6 performs appearance inspections on a component, mounted on board 90 by component mounter 5 upstream, as a target. Through the above described appearance inspection, the mounting state of the component on board 90, such as the suitability of the component mounted on board 90, and the mounting position and orientation of the component are recognized. Further, appearance inspection device 6 transmits, as an appearance inspection result, the degree of the mounting state together with the good or bad quality of the mounting state of the component to host PC 70.

Reflow furnace 7 heats board 90 conveyed from the upstream side in production line 1, melts the solder on board 90, and performs soldering. Function inspection device 8 performs a function inspection of soldered board 90. In detail, function inspection device 8 imparts a predetermined input signal to board 90 and acquires an output signal corresponding to the input signal. Function inspection device 8 then inspects whether the function of board 90 as an electronic circuit is normal based on the acquired output signal.

In this manner, production line 1 conveys board 90 to each production device in order, and executes the production process, including the inspection process, to produce the board product. The configuration of production line 1 can be appropriately subjected to additions or changes in accordance with, for example, the type of the board product to be produced. For example, production line 1 may be configured by installing another production device upstream from printer 2, at an intermediate position, or downstream from function inspection device 8. Examples of other production devices include board supplying devices, board flipping devices, shield mounting devices, adhesive application devices, and ultraviolet ray irradiation devices.

Host PC 70 monitors the operation status of production line 1 and controls each production device. Host PC 70 has storage device 71 configured by a hard disk, flash memory, and the like. Storage device 71 stores various data for controlling the multiple production devices by which production line 1 is configured. Specifically, storage device 71 stores a control program or the like for operating each production device.

1-2. Configuration of Component Mounter 5

Component mounter 5 includes board conveyance device 10, component supply device 20, component transfer device 30, part camera 41, board camera 42, and control device 50. In the following description, the horizontal width direction (i.e., the right and left direction in FIG. 2) of component mounter 5 is taken as the X-axis direction, the horizontal depth direction (i.e., the up and down direction in FIG. 2) of component mounter 5 is taken as the Y-axis direction, and the vertical direction (i.e., the front and rear direction in FIG. 2) perpendicular to the X-axis and the Y-axis is taken as the Z-axis direction.

Figure 2:
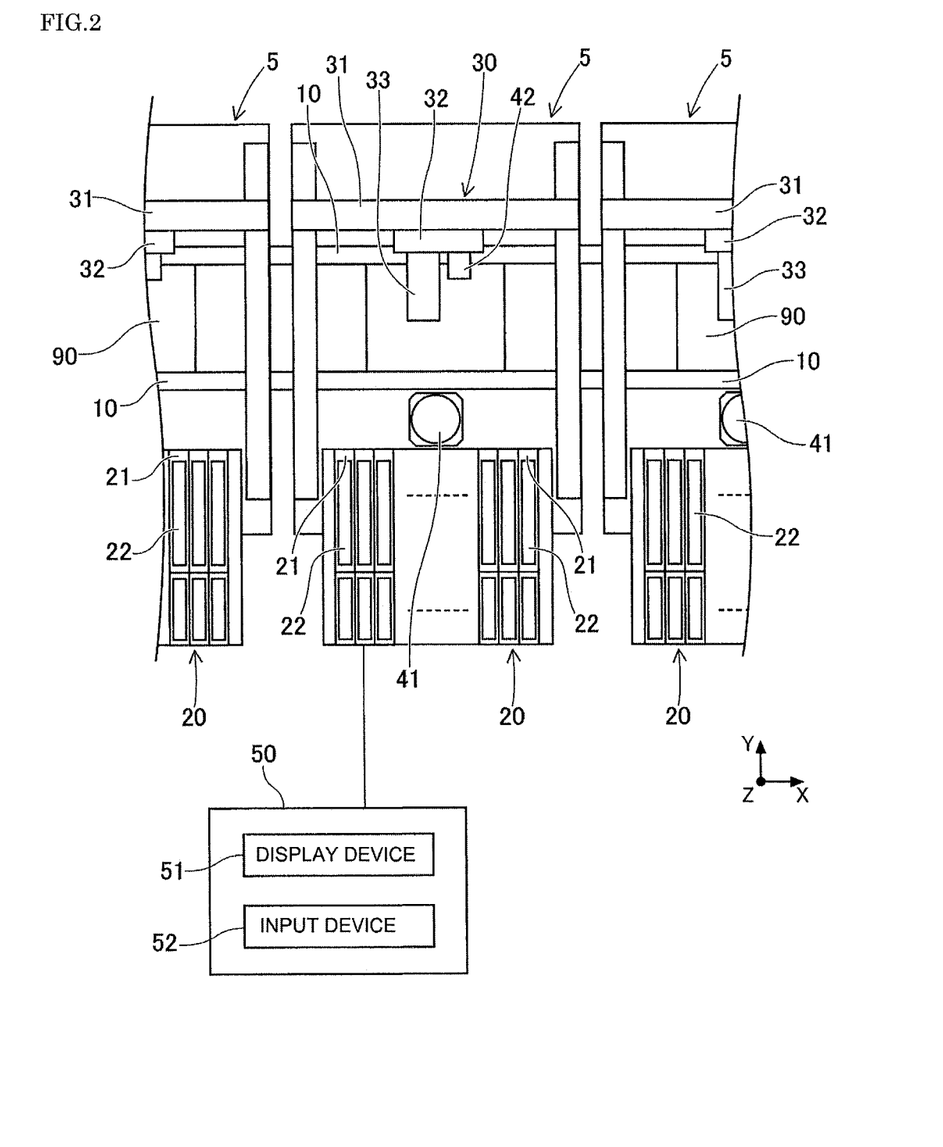
FIG. 2 is a schematic diagram showing a configuration of a component mounter in the production line of FIG. 1.

Board conveyance device 10 is configured by a belt conveyor or the like and conveys boards 90 sequentially in the conveyance direction (in the present embodiment, the X-axis direction). Board conveyance device 10 loads the board into component mounter 5 and positions board 90 at a predetermined position in the machine to bring the board into a clamped state. After mounting of the component by component mounter 5 is completed, board conveyance device 10 releases board 90 from the clamped state and conveys board 90 outside of component mounter 5.

Component supply device 20 supplies the component to be mounted on board 90. Component supply device 20 has multiple slots 21 disposed side by side in the X-axis direction. Feeder 22 is set in each of multiple slots 21 in an exchangeable manner. Feeder 22 feeds and moves a carrier tape accommodating a large number of the components to supply components to be picked up at a supply position positioned on the distal end of feeder 22.

Component transfer device 30 includes head driving device 31, moving table 32, and mounting head 33. Head driving device 31 is configured to move moving table 32 in the X-axis direction and the Y-axis direction by a linear motion mechanism. Mounting head 33 picks up the component supplied by component supply device 20 and mounts the component at the predetermined mounting position of board 90. Mounting head 33 is fixed to moving table 32 by a clamp member (not shown).

Mounting head 33 has one or multiple suction nozzles that are detachably provided. Mounting head 33 is configured to support the suction nozzle such that the suction nozzle is rotatable about an R-axis parallel to the Z-axis and capable of being raised and lowered. The raising/lowering position and angle of the suction nozzle respect to mounting head 33 and the negative pressure supply state of the suction nozzle are controlled. The suction nozzle is supplied with negative pressure enabling the suction nozzle to pick up the component supplied by feeder 22 of component supply device 20.

Part camera 41 and board camera 42 are digital imaging devices having an imaging element such as a charge coupled device (CCD) or a complementary metal oxide semiconductor (CMOS). Part camera 41 and board camera 42 capture an image having a range that falls within the field of view of the camera based on a control signal from communicably connected control device 50 and transmit image data acquired by imaging to control device 50.

Part camera 41 is fixed to a base of component mounter 5 such that the optical axis faces upward in the vertical direction (i.e., the Z-axis direction). Part camera 41 is configured to capture an image of a component held by the suction nozzle of mounting head 33 from below component transfer device 30. Board camera 42 is provided on moving body 32 of component transfer device 30 so that the optical axis faces downward in the vertical direction (Z-axis direction). Board camera 42 is configured to image of board 90.

Control device 50 is mainly configured by a CPU, various memories, and a control circuit, and mounts the component on board 90 based on the control program, for operating component mounter 5, and image data, acquired from imaging with part camera 41 and board camera 42. In detail, control device 50 controls the conveyance and positioning of board 90 by board conveyance device 10, the supply operation of components by component supply device 20, and the mounting operation by component transfer device 30. As a result, the position of mounting head 33 and the operation of the suction mechanism are controlled, and the position and the rotation angle of the suction nozzle supported by mounting head 33 are controlled.

Further, in the present embodiment, control device 50 includes display device 51 and input device 52. Display device 51 displays various types of information to be visible for an operator. In display device 51, for example, the control program is displayed during execution of the production process and information, such as the cause for maintenance and handling procedures, is displayed during the execution of the maintenance. Input device 52 receives editing by an operator with respect to the various information displayed on display device 51. Further, input device 52 receives changes in the needed time including the time to complete maintenance when maintenance is performed on component mounter 5.

1-3. Overview of Manufacturing Management Device 80

When the production process is executed by production line 1 configured as described above, each process is executed in the production devices, such as printer 2 and component mounter 5, and board 90 is sequentially conveyed downstream. During execution of such a production process, when an error requiring the operator's maintenance is detected in component mounter 5 and component mounter 5 is stopped, the production devices upstream from component mounter 5 are subsequently stopped by the stagnation of the conveyance of board 90.

It is assumed that the cause for the above-described maintenance is a shortage of components in component supply device 20, a defect in a supplied component, an operation defect of mounting head 33, a solder defect on board 90, or the like. Further, the cause for maintenance can be identified from detection results of various sensors in component mounter 5 and the results of image processing using part camera 41 and board camera 42. Further, the cause for maintenance can be specified together with component mounter 5 on which the target component is mounted, for example, based on the inspection result from appearance inspection device 6 and function inspection device 8. Further, manufacturing management device 80 may determine that maintenance is required in accordance with an execution time for maintenance planned in advance for the purpose of preventing an occurrence of an error or the like.

When the production process is suspended due to maintenance required in production line 1, in addition to decreasing production efficiency, board 90 in production may become a removal target, thereby resulting in waste. Therefore, manufacturing management device 80 manages the production process in production line 1 in order to reduce the number of removed boards 90 during production and minimize the decrease in production efficiency even when an error or the like requiring maintenance occurs. In the present embodiment, as shown in FIG. 1, an embodiment in which manufacturing management device 80 is incorporated in host PC 70 will be used as an example.

Manufacturing management device 80 acquires and monitors the processing states, the inspection results, or the like from each of the production devices by which production line 1 is configured. Specifically, manufacturing management device 80 monitors the presence or absence of a mounting error in which the component is not normally mounted in component mounter 5, the number of times recovery processing is executed for the mounting error, and the like. Mounting errors are detected based on image processing of image data acquired by imaging with part camera 41 and board camera 42, output values of sensors for monitoring the operation state of the suction mechanism of mounting head 33 or the like.

Examples of causes of mounting errors include complex causes such as changes in the production environment in addition to causes requiring maintenance such as the above-described component shortage. Further, in recovery processing for the mounting error, on which automatic restoration is attempted as a mounting error having occurred accidentally, and suspension of the mounting process (i.e., stopping of component mounter 5) is not performed. However, the cycle time may become longer than scheduled due to an increase in a pick-and-place cycle in which components are mounted on board 90 after the components have been picked up in the mounting process.

Here, in production line 1, the configuration of production line 1 and each process in each production device are optimized while taking into consideration the line balance such that differences in cycle time in each production device become small. However, for example, as the execution frequency of recovery processing in single component mounter 5 increases, a bottleneck may occur to decrease the production efficiency. Therefore, in such a case, it is possible to prevent a decrease in the production efficiency in the long term by performing maintenance to eliminate the cause of the mounting error.

When a mounting error occurs by a cause requiring maintenance, recovery processing is not executed. Further, in a case where the same mounting error continues for a predetermined number of times, even when recovery processing is executed, the mounting error may be determined to have occurred by the cause requiring maintenance. In this case, component mounter 5 requiring maintenance enters a standby state for the operator's maintenance by suspending the mounting process.

Even when the mounting state of the component on board 90 is good, manufacturing management device 80 monitors the amount of deviation with respect to the ideal mounting position and orientation as a degree of the mounting state based on the appearance inspection result transmitted from appearance inspection device 6, for example. Accordingly, manufacturing management device 80 recognizes whether the mounting precision of the component by component mounter 5 is maintained or showing signs of deterioration.

1-4. Detailed Configuration of Manufacturing Management Device 80

As shown in FIG. 1, manufacturing management device 80 includes determination section 81, conveyance management section 82, time calculation section 83, and level setting section 84. Determination section 81 determines whether maintenance is necessary for any of the multiple production devices during execution of the production process by production line 1. In detail, determination section 81 determines whether an operator's maintenance should be performed based on various types of information transmitted from production devices such as component mounter 5.

For example, even when one of multiple component mounters 5 executes recovery processing, determination section 81 determines that maintenance of above-described component mounter 5 is required upon receiving a notification that the same mounting error has continued for a predetermined number of times. In addition, in the mounting process by component mounter 5, determination section 81 determines that maintenance of component mounter 5 is required based on an increasing frequency of recovery processing or the cycle time of the mounting process becoming longer than scheduled.

Examples of causes by which the cycle time of the mounting process becomes longer than scheduled include an operation defect of each device such as component transfer device 30 in addition to the increase in the pick-and-place cycle in the mounting process accompanying the execution of recovery processing. For example, when dirt or the like accumulates in a movable section for operating mounting head 33, the actual moving speed in response to the same operation command changes and the time required for the operation becomes longer. In these cases, it is desirable to carry out maintenance to remove the dirt in the movable section of mounting head 33.

However, even when the cycle time becomes longer than scheduled, since the effect during the execution of a normal mounting process may be weak or may include noise, the determination cannot be easily made as to whether the cause is dirt in the movable section of mounting head 33. Therefore, in the present embodiment, determination section 81 determines whether maintenance is necessary based on the good or bad quality of a regulated operation of mounting head 33 in a predetermined period.

Specifically, manufacturing management device 80 first allows mounting head 33 to execute the regulated operation in parallel with the conveyance of board 90 by board conveyance device 10 of component mounter 5. Determination section 81 then determines whether maintenance of mounting head 33 is necessary based on the good or bad quality of the regulated operation. Examples of the regulated operation include the operation of raising and lowering the suction nozzle a predetermined number of times or the operation of rotating the suction nozzle by a predetermined angle. Determination section 81 determines whether maintenance of mounting head 33 is necessary based on whether the operation time required for the regulated operation of mounting head 33, a feedback control signal during the operation, power consumption during the operation, or the like is within a normal range.

Further, the regulated operation of mounting head 33 is executed in parallel with the conveyance of board 90 as described above. Examples of the conveyance of board 90 include loading before execution of the mounting process and unloading after execution of the mounting process. Since mounting head 33 is in the standby state during conveyance of board 90, manufacturing management device 80 executes the regulated operation by using this period. The regulated operation of mounting head 33 may be executed every predetermined number of times over multiple times board 90 is conveyed, may be executed upon recognition that the cycle time is longer than scheduled, or may be executed by a combination of the above-described settings.

Further, in the present embodiment, determination section 81 determines whether maintenance is necessary based on the appearance inspection result by appearance inspection device 6. Specifically, for example, in a case where the causes of a defect are determined to be the same as a result of multiple appearance inspections, determination section 81 identifies component mounter 5 which has performed the mounting of a component at a defective portion and determines that identified component mounter 5 needs maintenance.

Further, in a case where the appearance inspection result is not defective but the degree of the mounting state has deteriorated, determination section 81 determines that component mounter 5 which has performed the mounting needs maintenance for the decrease in mounting precision. Further, manufacturing management device 80 may identify a member which is subjected to the maintenance, such as mounting head 33 or the suction nozzle in component mounter 5 requiring the maintenance, based on the appearance inspection result. Hereinafter, a device having a cause for maintenance among the multiple production devices by which production line 1 is configured will be referred to as maintenance target device Rd.

Conveyance management section 82 controls the operation of the board conveyance device in each of the multiple production devices in production line 1, thereby managing the conveyance of board 90 in production line 1 as a whole. In a case where determination section 81 determines that maintenance is necessary, conveyance management section 82 stops, at a predetermined time, loading of board 90 onto reference device Sd positioned upstream in production line 1 from maintenance target device Rd, a device among the multiple production devices by which production line 1 is configured.

That is, when it is determined that maintenance is necessary, conveyance management section 82 stops loading of board 90 onto reference device Sd in addition to stopping maintenance target device Rd. As a result, reference device Sd stops at the predetermined time based on a command from conveyance management section 82 rather than by stagnation of the conveyance of board 90. Further, reference device Sd is a reference for conveyance control of board 90 in production line 1 and is selectively set in accordance with the configuration of production line 1 or the like.

Specifically, as shown in FIG. 1, in a case where, for example, maintenance target device Rd is set to be the fifth from the upstream side of multiple component mounters 5, reference device Sd is positioned upstream in production line 1 from this component mounter 5. Reference device Sd may be fixed to a predetermined production device in production line 1, or may change depending on maintenance target device Rd.

In the present embodiment, reference device Sd is a production device positioned at the head of production line 1, that is, printer 2, which prints solder as a bonding material on board 90. Here, the viscosity of the solder which is applied to board 90 by printer 2 gradually decreases over time as the solder dries after printing is completed. When the viscosity of the solder decreases to a value less than a regulated value, the function as the bonding material decreases such that the mounted component is likely to deviate or tilt from the mounting position, possibly leading to a mounting error.

For this reason, time limit Tm is set for board 90, which has been unloaded from printer 2 after the print process is completed, to pass through all component mounters 5 positioned downstream in production line 1. Time limit Tm is set as a time period during which the viscosity of the solder is maintained at or above the regulated value from the completion of the print process by printer 2. In detail, time limit Tm is set based on at least one of the type of board product produced in production line 1, the production environment in production line 1, and the type of the bonding material for bonding board 90 and the component.

When the types of board products are different from each other, the shape and amount of solder applied to board 90 varies, and likelihood of a change in solder viscosity varies. In addition, when the production environment (temperature or humidity) of production line 1 changes, similarly, the likelihood of solder viscosity change varies. In addition, when the types of solder used as the bonding material are different from each other, the initial viscosity and the likelihood of solder viscosity change varies. Therefore, by setting time limit Tm based on at least one of the above factors, a more accurate time limit Tm is set.

In addition to stopping the loading of board 90 onto reference device Sd, conveyance management section 82 grants or denies permission for conveyance of board 90, in the production device, positioned between reference device Sd and maintenance target device Rd, cancels stopping of the loading of board 90 onto reference device Sd, or the like. Details of the management of the conveyance of board 90 in production line 1 by conveyance management section 82 will be described below.

Time calculation section 83 calculates required time Tr for maintenance based on the type of the maintenance. The examples of the "type of the maintenance" include a mechanical system related to the state and operation of the production device and a communication system related to the communication with host PC 70, and the "type of the maintenance" indicates the degree of technical difficulty required for executing the maintenance. As a method for calculating required time Tr by time calculation section 83, for example, the required time for each of multiple steps in the maintenance may be summed, or required time Tr may be acquired from maintenance information M1 indicating the relation between the type of the maintenance and required time Tr.

Here, required time Tr for maintenance may increase or decrease in accordance with the technical level or the work performance of the operator who actually performs the maintenance, even in a case of calculating an average value, for example. Therefore, in a case where the maintenance is determined to be necessary, time calculation section 83 acquires the technical level or the work performance of the operator who performs the maintenance when the maintenance is determined to be necessary based on operator information M2 in which the technical level and the work performance of the operators are recorded for each operator. Time calculation section 83 then adjusts required time Tr for the maintenance in accordance with the acquired technical level or the work performance.

Specifically, in a case where the technical level of the operator in charge is low, with respect to the type of maintenance, or the work performance is low, in accordance with the level and performance, time calculation section 83 performs the adjustment to add a predetermined time to required time Tr calculated originally. On the other hand, in a case where a record is made in which the operator in charge has performed the same maintenance multiple times in the past, an adjustment is made to subtract the predetermined time from required time Tr originally calculated based on the time required for execution of maintenance in the past.

Further, manufacturing management device 80 displays calculated required time Tr for maintenance for the operator who performs the maintenance, and receives the edit of required time Tr for maintenance by the operator. Specifically, manufacturing management device 80 first transmits required time Tr for maintenance to maintenance target device Rd. Accordingly, required time Tr is displayed on display device 51 of control device 50 in maintenance target device Rd. Next, manufacturing management device 80 receives the operator's edit of required time Tr via input device 52 of control device 50.

As a result, the edit by the operator who actually performs the maintenance is reflected in required time Tr, and required time Tr is set more accurately. As an editing method by the operator, a method of directly inputting required time Tr or receiving the increase or decrease of the predetermined value may be adopted. Further, by receiving the maintenance completion report, manufacturing management device 80 may edit required time Tr to be the difference between a maintenance start time and a maintenance completion time.

Level setting section 84 sets maintenance level Lm in accordance with the needs in a case where maintenance is determined to be necessary for mounting head 33. "Maintenance level Lm" indicates the degree of importance of maintenance in the production process. Therefore, from the viewpoint of production efficiency and production cost, as maintenance level Lm is higher, the urgency is higher, the quick execution of maintenance can prevent the decrease in production efficiency, and the number of removed boards 90 decreases preventing the increase of production cost.

On the other hand, in a case where maintenance level Lm is low, the production efficiency may instead decrease by stopping maintenance target device Rd for maintenance; however, it is possible to prevent the production efficiency from decreasing in the long term. Therefore, determination section 81 of manufacturing management device 80 determines whether executing maintenance is necessary in consideration of the extent of progress of the production plan and maintenance level Lm. That is, for example, in a case where the degree of progress of the production plan is close to completion and maintenance level Lm is low, determination section 81 determines that maintenance is unnecessary and continues the production process.

In the present embodiment, in a case where determination section 81 determines that maintenance of mounting head 33 is necessary based on the good or bad quality of the regulated operation of mounting head 33, level setting section 84 sets maintenance level Lm in accordance with the degree of the good or bad quality of the regulated operation. Here, the operation defect of mounting head 33 gradually changes depending on, for example, the dirtiness of the movable section, and even when the regulated operation is defective at a certain level or higher, maintenance level Lm is not necessarily constant. Therefore, level setting section 84 sets maintenance level Lm in accordance with the degree of the good or bad quality of the regulated operation, that is, the degree of the defect, as described above.

In the present embodiment, in a case where determination section 81 determines that maintenance is necessary based on the appearance inspection result, level setting section 84 sets maintenance level Lm in accordance with the degree of the appearance inspection result. Here, since the decrease of the mounting precision is caused by, for example, the dirt of the movable section of mounting head 33 or the like in component mounter 5, or is caused by the variation of a parameter of the mounting process or the production environment, maintenance level Lm is not necessarily constant even when the mounting precision is deteriorated to a certain level or less. Therefore, level setting section 84 sets maintenance level Lm in accordance with the degree of the appearance inspection result, that is, the degree of the defect, as described above.

1-5. Management of Production Process by Manufacturing Management Device 80

Figure 3:
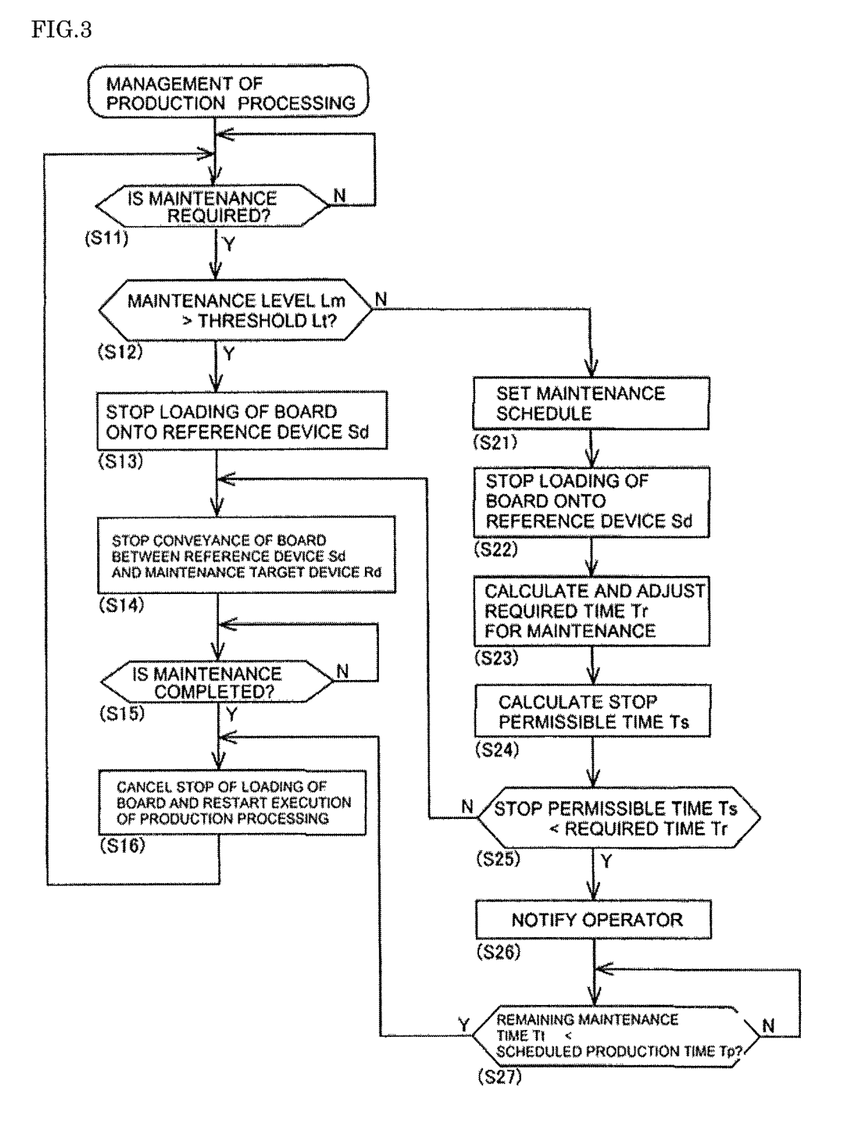
FIG. 3 is a flowchart showing management of a production process by a manufacturing management device.

The management of the production process by manufacturing management device 80 will be described with reference to FIG. 3. When the production process in production line 1 is executed, manufacturing management device 80 starts the management of the production process. When the management of the production process is started, the process for detecting the cause for maintenance (see FIG. 4) is executed in parallel. When the cause for maintenance by the above detection process is detected, maintenance target device Rd having the cause for maintenance is identified and maintenance level Lm is set. Details of the process for detecting the cause for maintenance will be described below.

Determination section 81 determines whether maintenance is necessary in any of the production devices based on the result of process for detecting the cause for maintenance (step 11 (hereinafter, "step" is referred to as "S"). In a case where maintenance is unnecessary in any of the production devices (S11: No), determination section 81 repeats the determination of whether maintenance is necessary (S11) at a constant cycle until the production process is completed.

Here, it is assumed that the cause for maintenance is detected in fifth component mounter 5 from the upstream side among multiple component mounters 5 by the process for detecting the cause for maintenance. Hereinafter, fifth component mounter 5 is referred to as maintenance target device Rd, and printer 2 positioned at the head of production line 1 is referred to as reference device Sd (see FIG. 1). In a case where determination section 81 determines that maintenance is necessary (S11: Yes), conveyance management section 82 determines whether maintenance level Lm is higher than preset threshold Lt (S12).

In the present embodiment, as the production process cannot be continued unless maintenance causing level Lm to exceed threshold Lt is performed, or even when the production process can be continued, the possibility of determining the defect is at a certain level or higher by the appearance inspection or the like, and thus above described threshold Lt is a value for indicating the maintenance of which quick execution is desirable. Threshold Lt is set in advance by a manager or the like of production line 1.

In a case where maintenance level Lm is higher than threshold Lt (S12: Yes), conveyance management section 82 stops the loading of board 90 onto reference device Sd (S13). That is, conveyance management section 82 stops the loading of board 90 onto printer 2, which is reference device Sd, at the timing at which it is determined that maintenance level Lm is higher than the threshold. As a result, production line 1 is in a state in which new board 90 is not loaded.

Conveyance management section 82 stops conveyance of board 90 in all production devices positioned between reference device Sd and maintenance target device Rd (S14). That is, among printer 2, which is reference device Sd, print inspection device 3, first buffer device 4, and multiple component mounters 5, for component mounters 5 up to the fifth one in production line 1, the unloading of board 90 downstream is not performed even when the process of a host machine (for example, mounting process by component mounter 5) is completed.

In this case, when the probability is determined to be high that board 90 held between reference device Sd and maintenance target device Rd will be a removal target in the future, manufacturing management device 80 may also stop the execution of each process by each production device. This is to prevent the component to be mounted on board 90 from becoming a removal target when the mounting process by component mounter 5 is continued.

Conveyance management section 82 determines whether maintenance is completed in this state (S15). In a case where maintenance is not completed (S15: No), conveyance management section 82 repeats the determination of whether maintenance is completed (S15) at a constant cycle until the maintenance is completed. For example, in a case where a maintenance completion notification is received from the operator and maintenance is determined to be completed (S15: Yes), conveyance management section 82 cancels the stopping of the loading of board 90 onto reference device Sd and restarts execution of the suspended production process (S16).

In a case where maintenance level Lm is lower than threshold Lt (S12: No), manufacturing management device 80 sets a maintenance schedule (S21). Here, in a case where maintenance level Lm is lower than threshold Lt, the necessity for immediately executing the maintenance is low. Therefore, the timing at which the production process is suspended can be appropriately set in a certain period. Therefore, manufacturing management device 80 sets the maintenance schedule based on the extent of progress of the production plan.

Specifically, manufacturing management device 80 can set the timing at which the type of board product to be produced is changed to be the maintenance schedule. Alternatively, the maintenance schedule may be set as the current time, may be set as the time after the time period needed from the current time to produce a fixed number of board products, or may be set as the time at which the operator in charge of maintenance is replaced.

Next, conveyance management section 82 stops the loading of board 90 onto reference device Sd at a time in accordance with a set maintenance schedule (S22). The time according to the maintenance schedule is the time at which the loading of board 90 onto reference device Sd is stopped such that the operator can perform maintenance on maintenance target device Rd at the time when maintenance is scheduled.

Here, in a case where maintenance is performed on maintenance target device Rd, board 90 may not be held between reference device Sd and maintenance target device Rd, as described below. In this case, the time according to the maintenance schedule is the time obtained by tracing back the production time it takes for board 90 to pass from reference device Sd to maintenance target device Rd, from the time when the maintenance is scheduled.

Subsequently, time calculation section 83 calculates required time Tr for maintenance based on the type of maintenance, and adjusts required time Tr in accordance with the technical level or the work performance of the operator performing the maintenance (S23). Required time Tr is displayed for the operator by display device 51 of control device 50. Thereafter, in a case where editing of required time Tr for the maintenance by the operator is received, time calculation section 83 sets required time Tr to reflect the edit.

Time calculation section 83 calculates stop permissible time Ts (S24). Here, elapsed time Te from unloading of board 90 from reference device Sd until loading of board 90 onto maintenance target device Rd, and scheduled production time Tp that it takes for board 90 to pass through all component mounters 5 positioned downstream in production line 1 from maintenance target device Rd are deducted from time limit Tm (Tm−Te−Tp) to obtain a time, which is defined as stop permissible time Ts indicating the time at which the production process can be stopped while loaded board 90 is held in maintenance target device Rd (Ts=Tm−Te−Tp).

As described above, in a case where maintenance level Lm is lower than threshold Lt (S12: No), the necessity of immediately executing maintenance is low, and the time to suspend the production process can be appropriately set within a certain period. Further, examples of maintenance include maintenance in which level Lm is lower than threshold Lt but required time Tr is long. When such maintenance is executed at a time determined to be necessary, board 90 held between reference device Sd and maintenance target device Rd may become a removal target or the like after time limit Tm has elapsed.

Conveyance management section 82 compares stop permissible time Ts calculated as described above with required time Tr for maintenance (S25). In a case where stop permissible time Ts is shorter than required time Tr for maintenance (S25: Yes), conveyance management section 82 permits the conveyance of board 90 loaded on reference device Sd at a time when the loading of board 90 onto reference device Sd is stopped. That is, when loading of board 90 onto reference device Sd is stopped at a time in accordance with the maintenance schedule (S22), conveyance management section 82 permits board 90, already held in the production device downstream in production line 1 from reference device Sd, to continue the production process.

As a result, after the stopping of the loading of board 90 onto reference device Sd and execution of the production process for the predetermined number of boards 90, board 90 is no longer loaded and maintenance target device Rd stops. As an approximation, maintenance target device Rd stops at the time at which the production time required for board 90 to pass from reference device Sd to maintenance target device Rd elapses from the time at which loading of the board onto reference device Sd is stopped.

Manufacturing management device 80 notifies the operator that maintenance target device Rd has been stopped and is ready for maintenance (S26). The operator who has received the notification appropriately starts maintenance of maintenance target device Rd. When maintenance is started, manufacturing management device 80 starts a timer and measures time Tn elapsed since the start of maintenance on maintenance target device Rd.

Thereafter, when maintenance is completed, the production process in production line 1 can be restarted. However, during the execution of maintenance, board 90 is not held between reference device Sd and maintenance target device Rd in S25. As a result, even when maintenance is completed, if it becomes the case that maintenance target device Rd stands by until the loading of board 90 on which the production process has been sequentially executed from the upstream side in production line 1, time may be wasted. Therefore, manufacturing management device 80 restarts the production process before completing maintenance in expectation of the completion of the maintenance.

Here, the difference (Tr−Tn) between required time Tr for the maintenance and time Tn elapsed since the start of the maintenance on maintenance target device Rd is defined as remaining maintenance time Tt indicating the necessary time until the completion of the maintenance (Tt=Tr−Tn). Then, conveyance management section 82 determines whether remaining maintenance time Tt is shorter than scheduled production time Tp for passing through the immediately preceding production device of maintenance target device Rd from reference device Sd (S27).

In a case where remaining maintenance time Tt is longer than scheduled production time Tp (S27: No), conveyance management section 82 maintains the standby state of the production device from reference device Sd to maintenance target device Rd, and repeats the comparison and the determination of remaining maintenance time Tt and scheduled production time Tp (S27) at a predetermined cycle. In a case where remaining maintenance time Tt is shorter than scheduled production time Tp (S27: Yes), conveyance management section 82 cancels the stopping of the loading of board 90 onto reference device Sd. Accordingly, the execution of the production process that has been suspended is restarted with the expectation of the completion of the maintenance (S16).

As a result, it is possible to shorten the standby time accompanying the maintenance in the production device between reference device Sd and maintenance target device Rd. Further, in a case where required time Tr for the maintenance becomes longer after the production process is restarted, even when the unloading of board 90 is attempted from immediately preceding component mounter 5 of maintenance target device Rd, loading onto maintenance target device Rd is not permitted. Therefore, the production devices upstream from maintenance target device Rd are subsequently stopped. Further, when maintenance on maintenance target device Rd is completed, board 90 is permitted to be loaded onto maintenance target device Rd, and the production process is restarted appropriately. In this case, the standby time of maintenance target device Rd is 0.

Further, remaining maintenance time Tt may gradually decrease over time and may increase or decrease with the edit of required time Tr for maintenance by the operator. For example, when the operator inputs the maintenance completion notification, remaining maintenance time Tt becomes 0, stopping of the loading of board 90 onto reference device Sd is cancelled, and execution of the production process is restarted (S16).

On the other hand, in a case where stop permissible time Ts is longer than required time Tr for maintenance (S25: No), when the maintenance is completed and the production process is restarted, any board 90 can pass through all component mounters 5 without exceeding time limit Tm. Therefore, in a case where stop permissible time Ts is longer than required time Tr for the maintenance (S25: No), conveyance management section 82 stops the conveyance of board 90 in all the production devices positioned between reference device Sd and maintenance target device Rd (S14).

When the production process is suspended in this manner, the production device positioned between reference device Sd and maintenance target device Rd is stopped while holding board 90. Subsequently, when maintenance is completed (S15: Yes) and the suspended production process is restarted, board 90 is loaded from an immediately preceding component mounter 5 onto maintenance target device Rd. As a result, the standby time of maintenance target device Rd is shortened.

1-6. Process for Detecting the Cause for Maintenance

Figure 4:
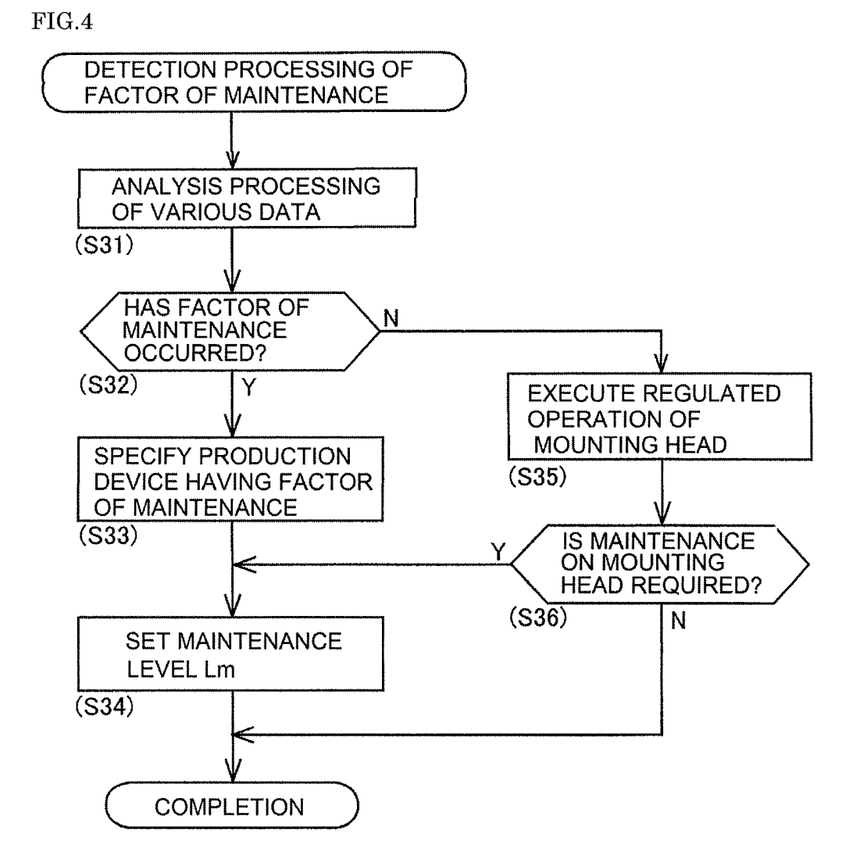
FIG. 4 is a flowchart showing a process for detecting a cause for maintenance.

The process for detecting the cause for maintenance by manufacturing management device 80 will be described with reference to FIG. 4. In parallel with the above-described management of the production process, manufacturing management device 80 executes the process for detecting the cause for maintenance at a constant end period. Manufacturing management device 80 first analyzes various data transmitted from each production device (S31). Examples of the analyses of various data include analysis of the frequency of a print error and mounting error in the production process, a delay in the scheduled cycle time, and the appearance inspection result.

Determination section 81 determines whether the cause for maintenance has occurred based on the analysis result of the various data (S32). Specifically, in a case where the frequency of a mounting error and the frequency of executing recovery processing for a mounting error are equal to or higher than the regulated value, and in a case where the delay time with respect to the scheduled cycle time is equal to or higher than a regulated time, determination section 81 determines that there is a cause for maintenance (S32: Yes).

Further, for example, in a case where defects are determined to be due to the same cause as a result of the multiple appearance inspections, determination section 81 determines that component mounter 5, which has performed the mounting of the component at the defective portion, has a cause for maintenance (S32: Yes). Further, in a case where the appearance inspection result is not defective but the degree of the mounting state is deteriorated, determination section 81 determines that component mounter 5, with the mounting precision being decreased, has a cause for maintenance (S32: Yes).

In a case where a certain production device is determined to have a cause for maintenance (S32: Yes), manufacturing management device 80 identifies the production device having the cause for maintenance (S33). Specifically, it is assumed that for the maintenance caused by the print error or the mounting error, the production device in which the error has occurred has the factor of the maintenance, and for the maintenance caused by the appearance inspection result, the production device of component mounter 5 that has performed the mounting of the component at the defective portion has the factor of the maintenance (maintenance target device Rd).

Level setting section 84 sets maintenance level Lm (S34). Specifically, level setting section 84 sets level Lm based on the detected cause for maintenance. For example, when it is determined that maintenance is necessary based on the appearance inspection result (S32: Yes), level setting section 84 sets maintenance level Lm in accordance with the degree of the appearance inspection result, that is, the degree of the defect. For example, level setting section 84 sets maintenance level Lm to be high as the amount of the deviation with respect to the ideal mounting position or orientation becomes large.

In a case where maintenance is determined to be necessary based on the frequency of the print error and the mounting error in the production process and the delay time with respect to the scheduled cycle time (S32: Yes), level setting section 84 may set maintenance level Lm to be high as the frequency of the mounting error or the like is high or as the delay time becomes long. Further, level setting section 84 may set a preset fixed value to maintenance level Lm regarding the cause for maintenance relating to the frequency of the mounting error, the delay of the mounting process, or the like.

Here, in a case where no cause for maintenance has been determined in the analysis of the various data (S31) (S32: No), manufacturing management device 80 instructs component mounter 5 conveying board 90 among multiple component mounters 5 to execute the regulated operation of mounting head 33 according to a predetermined schedule. Accordingly, component mounter 5 that has received the command allows mounting head 33 to execute the regulated operation (S35). Further, examples of the "predetermined schedule" may include a case of recognizing that the average cycle time in component mounter 5 becomes long when the number of productions of board products corresponding to the number of conveyances of board 90 reaches a regulated value.

Next, determination section 81 determines whether maintenance of mounting head 33 is necessary based on the good or bad quality of the regulated operation (S36). For example, in a case where the operation time required for the regulated operation of mounting head 33 is equal to or longer than the regulated value, determination section 81 determines that dirt in the movable section of mounting head 33 is the cause for maintenance (S36: Yes). Accordingly, manufacturing management device 80 recognizes that maintenance of cleaning the movable section of mounting head 33 is necessary.

Then, in a case where determination section 81 determines that maintenance on mounting head 33 is required based on the good or bad quality of the regulated operation of mounting head 33 (S36: Yes), level setting section 84 sets maintenance level Lm in accordance with the degree of the good or bad quality of the regulated operation, that is, the degree of the defect (S34). For example, level setting section 84 sets maintenance level Lm high as the operation time required for the regulated operation becomes long.

2. Effects of Configuration of Embodiment

As described above, manufacturing management device 80 disclosed in the present specification is applied to production line 1 configured by installing multiple production devices each including component mounter 5 configured to mount a component on board 90 in the conveyance direction of board 90. Manufacturing management device 80 includes: determination section 81 configured to determine whether maintenance on any of the multiple production devices is necessary during execution of the production process by production line 1; and conveyance management section 82 configured to stop, at a predetermined time when it is determined that maintenance is necessary, loading of board 90 onto reference device Sd positioned upstream in the production line 1 from maintenance target device Rd having a cause for maintenance, the device being among the multiple production devices.

With such a configuration, when maintenance is determined to be necessary in production line 1, loading of board 90 onto reference device Sd positioned upstream from maintenance target device Rd is stopped at the predetermined time (S13 and S22). Accordingly, the number of boards 90 held between reference device Sd and maintenance target device Rd can be reduced in comparison with, for example, the configuration in which loading of board 90 onto reference device Sd is stopped due to stagnation of conveyance of board 90 accompanying the stopping of maintenance target device Rd. As a result, the number of removed boards 90 during the production can be reduced.

In a case where maintenance level Lm is higher than preset threshold Lt (S12: Yes), conveyance management section 82 stops loading of board 90 onto reference device Sd (S13) and stops conveyance of board 90 in all the production devices positioned between reference device Sd and maintenance target device Rd (S14). Accordingly, even when board 90 held between reference device Sd and maintenance target device Rd becomes a removal target, the number of removed boards 90 can be reduced and the production process can be quickly restarted. Therefore, the production efficiency of production line 1 as a whole can be improved.

In a case where maintenance level Lm is lower than preset threshold Lt (S12: No), conveyance management section 82 stops loading of board 90 onto reference device Sd at a time in accordance with the maintenance schedule (S22). Accordingly, for example, conveyance management section 82 can stop loading of board 90 onto reference device Sd at a time in accordance with the maintenance schedule set based on the production plan, that is, at the current time or after the production process is continued to some extent (S22).

Accordingly, it is possible to manage the maintenance based on priorities in the production process.

Reference device Sd is the production device positioned at the head of production line 1. With such a configuration, in a case in which it is determined that maintenance is necessary, manufacturing management device 80 stops the loading of board 90 onto reference device Sd positioned at the head of production line 1 (S13 and S22). Accordingly, the number of boards 90 conveyed in production line 1 can be reduced. Therefore, the number of boards 90 held between reference device Sd at the head of production line 1 and maintenance target device Rd can be reduced, and the number of removed boards 90 accompanying the cause for maintenance can be reduced.

Reference device Sd is the production device in which time limit Tm is set from the time when board 90 is unloaded to the time until board 90 passes through all component mounters 5 positioned downstream in production line 1. With such a configuration, in a case in which it is determined that maintenance is necessary, manufacturing management device 80 stops the loading of board 90 onto the production device (in the present embodiment, printer 2) in which time limit Tm is set to board 90 accompanying the process of the host machine. As a result, even when required time Tr for the maintenance becomes long, it is possible to reduce the number of removed boards 90 due to the elapse of time limit Tm.

In a case where maintenance level Lm is lower than preset threshold Lt (S12: No) and stop permissible time Ts is shorter than required time Tr for maintenance (S25: Yes), conveyance management section 82 permits the conveyance of board 90 loaded on reference device Sd at the time at which loading of board 90 onto reference device Sd is stopped.

As a result, manufacturing management device 80 permits conveyance of board 90 that has already been loaded on production line 1 from reference device Sd to the downstream side and continues execution of the production process. Accordingly, even when required time Tr for maintenance becomes long, since board 90 is not held between reference device Sd and maintenance target device Rd, the number of removed boards 90 accompanying the maintenance can be zero.

In a case where remaining maintenance time Tt is shorter than scheduled production time Tp of passing through from reference device Sd to the immediately preceding production device of maintenance target device Rd (S27: Yes), conveyance management section 82 cancels the stopping of the loading of board 90 onto reference device Sd and restarts the execution of the production process (S16). As a result, the production process is restarted in the expectation of the completion of maintenance, and board 90 can be quickly loaded onto maintenance target device Rd after the completion of maintenance. Therefore, it is possible to shorten the standby time of maintenance target device Rd after the completion of maintenance.

In a case where maintenance level Lm is lower than threshold Lt (S12: No) and stop permissible time Ts is longer than required time Tr for maintenance (S25: No), conveyance management section 82 stops conveyance of board 90 in all the production devices positioned between reference device Sd and maintenance target device Rd (S14). When the production process is suspended in this manner, the production device positioned between reference device Sd and maintenance target device Rd is stopped while holding board 90. Therefore, when the maintenance is completed thereafter (S15: Yes) and the suspended production process is restarted (S16), board 90 can be quickly loaded onto maintenance target device Rd. Accordingly, the standby time of maintenance target device Rd after the completion of the maintenance is shortened.

Manufacturing management device 80 further includes time calculation section 83 configured to calculate required time Tr for the maintenance based on the type of maintenance. With such a configuration, required time Tr is calculated based on the type of maintenance (S23). Accordingly, required time Tr for the maintenance can be more accurately acquired. Therefore, it is possible to more accurately execute the determination process (S25, S27) or the like using required time Tr for maintenance.

Manufacturing management device 80 displays calculated required time Tr for maintenance for the operator who performs the maintenance, and receives the edit of required time Tr for maintenance by the operator (S23). With such a configuration, the edit by the operator who actually performs the maintenance is reflected in required time Tr, and required time Tr can be set more accurately.

Time calculation section 83 adjusts required time Tr for maintenance in accordance with the technical level or the work performance of the operator who performs the maintenance at the time at which maintenance is determined to be necessary (S23). Accordingly, required time Tr reflecting the technical level of the operator in charge or the like can be acquired.

Time limit Tm set for board 90 is set based on at least one of the type of board product produced in production line 1, the production environment in production line 1, and the type of bonding material configured to bond board 90 and the component. With such a configuration, time limit Tm is set based on at least one type of board product or the like, and a more accurate time limit Tm can be acquired. Therefore, the determination process (S25) using stop permissible time Ts can be more accurately executed.

Reference device Sd is printer 2 configured to print solder as bonding material on board 90. Time limit Tm is set as the time during which the viscosity of the solder is maintained at the regulated value or higher from the completion of the print process by printer 2. With such a configuration, stop permissible time Ts can be more accurately calculated by using time limit Tm set in this manner for the management of the production process. Accordingly, by accurately performing each determination process (S25) or the like, it is possible to reduce the number of removed boards 90 accompanying the maintenance and improve production efficiency.

Component mounter 5 includes: board conveyance device 10 configured to convey board 90; component supply device 20 configured to supply the component; and mounting head 33 configured to pick up the component supplied by component supply device 20 and mount the component on the upper face of board 90. Manufacturing management device 80 allows mounting head 33 to execute the regulated operation in parallel with the conveyance of board 90 by board conveyance device 10 (S35). Determination section 81 determines whether maintenance for mounting head 33 is necessary based on the good or bad quality of the regulated operation (S36).

With such a configuration, the regulated operation is executed during the period (i.e., the conveyance period of board 90) during which the production process is not affected (S35). Therefore, it is possible to prevent the decrease of the production efficiency accompanying execution of the regulated operation (S35). Further, by appropriately setting the regulated operation, it is possible to quickly detect the cause for maintenance which is not detected in the normal production process.

Manufacturing management device 80 further includes level setting section 84 configured to set maintenance level Lm in accordance with the degree of good or bad quality of the regulated operation in a case where the maintenance of mounting head 33 is determined to be necessary (S36: Yes). Since level setting section 84 sets maintenance level Lm in accordance with the degree of good or bad quality of the regulated operation (S34), the necessity of maintenance and required time Tr can be more accurately calculated.

Production line 1 includes appearance inspection device 6 configured to perform the appearance inspection on the component, as the target, mounted on board 90 by component mounter 5 on the upstream side. Determination section 81 determines whether maintenance is necessary based on the appearance inspection result (S11 and S32). With such a configuration, it is possible to detect the cause for maintenance by reflecting the appearance inspection result. Accordingly, the cause for maintenance can be quickly detected. Further, a member which is subjected to maintenance, such as mounting head 33 or the suction nozzle, may be identified from identified component mounter 5 based on the appearance inspection result. Accordingly, it is possible to more accurately guide maintenance and prevent the decrease in the production efficiency accompanying the maintenance.

Manufacturing management device 80 further includes level setting section 84 configured to set maintenance level Lm in accordance with the degree of the appearance inspection result in a case where the maintenance is determined to be necessary (S32: Yes). Accordingly, whether maintenance is necessary and required time Tr can be more accurately calculated.

3. Modifications of the Embodiment 3-1. Detection of the Cause for Maintenance In the embodiment, manufacturing management device 80 is configured to detect the cause for maintenance based on the result of the analysis process on various data (S31) or the like. On the other hand, for example, manufacturing management device 80 may detect, as a cause for maintenance, the fact that the execution time of maintenance planned for the predetermined production device has been reached or that the execution time is approaching. In such a state, maintenance plan M3 indicating the execution time of maintenance is preset in some of the multiple production devices.

Examples of the "execution time of maintenance" include the time when a predetermined time has elapsed from the execution of the mounting process, the time when the number of mounting processes executed has reached a regulated value, the time when the number of times a suction nozzle used for mounting the component has reached a regulated value, and the time when the number of times a certain feeder 22 supplying the component has reached a regulated value, and the "execution time of maintenance" may differ depending on the type of maintenance. In the maintenance plan, along with the execution time, for example, each device such as mounting head 33 by which component mounter 5 is configured is scheduled to become a maintenance target.

In such a state, determination section 81 determines whether maintenance for any of the multiple production devices is necessary based on maintenance plan M3. That is, in a case where maintenance plan M3 is set, determination section 81 determines that maintenance of the corresponding production device is necessary periodically or when a certain condition is satisfied regardless of the presence or absence of the cause for maintenance. Specifically, based on the period from the current time to the execution time of the maintenance (for example, the time at which the number of mounting processes executed using mounting head 33 currently in use reaches a regulated value) becomes equal to or less than the predetermined value, determination section 81 determines the cause for maintenance of the corresponding production device.

In a case where maintenance is determined to be necessary based on maintenance plan M3 as described above, the scheduled maintenance time is set in accordance with the execution time of maintenance indicated by maintenance plan M3 in the setting process for scheduled maintenance (S21). Further, in the above case, since a sufficient period is provided until the execution time of maintenance, level setting section 84 sets maintenance level Lm to be lower than threshold Lt. Further, in a case where maintenance is determined to be necessary based on maintenance plan M3 as described above, conveyance management section 82 stops loading of board 90 onto reference device Sd at a time in accordance with maintenance plan M3 (S22).

Accordingly, conveyance management section 82 can stop loading of board 90 onto reference device Sd at a time in accordance with the preset maintenance plan based on, for example, the production plan, or the number of times of consumables being used, that is, at the time at which the production process is continued to some extent (S22). Accordingly, it is possible to systematically execute the necessary maintenance.

3-2. Regarding Management of Production Process

In the embodiment, in a case where maintenance level Lm is higher than threshold Lt (S12: Yes), conveyance management section 82 stops conveyance of board 90 in all production devices positioned between reference device Sd and maintenance target device Rd (S14). On the other hand, conveyance management section 82 may continue the conveyance of board 90 in some or all of the production devices on the upstream side based on the configuration of production line 1 and required time Tr for maintenance.

For example, although maintenance level Lm is high, in some cases, required time Tr may be short, and a quick restart of the production process may be expected due to the execution of the maintenance. In such a case, for example, with buffer device 4 holding multiple boards 90, it is possible to eliminate the need to suspend the production process. In this manner, conveyance management section 82 can manage conveyance of board 90 of the production device on the upstream side based on the configuration of production line 1 or the like.

In the embodiment, reference device Sd is set to be printer 2 which is a production device positioned at the head of production line 1 and is a production device in which time limit Tm is set to board 90 accompanying the process of the host machine. On the other hand, reference device Sd may be set to be any production device among the multiple production devices by which production line 1 is configured, except for the production device at the end. For example, reference device Sd may be set as component mounter 5 positioned in the middle of production line 1.

In the embodiment, in a case where maintenance level Lm is lower than threshold Lt (S12: No), it is determined whether required time Tr for maintenance is longer than stop permissible time Ts (S25: Yes). On the other hand, conveyance management section 82 may permit conveyance of the board between reference device Sd and maintenance target device Rd regardless of the relation between required time Tr for maintenance and stop permissible time Ts. Since the maintenance may exceed required time Tr or the start of maintenance may be delayed, board 90 is permitted to be conveyed uniformly even when maintenance level Lm is lower than threshold Lt. Accordingly, it is possible to reliably suppress the removal of board 90.

In the embodiment, in a case where conveyance of board 90 between reference device Sd and maintenance target device Rd is permitted (S25: Yes), conveyance management section 82 cancels stopping of loading of board 90 onto reference device Sd and restarts execution of the production process (S16) when remaining maintenance time Tt becomes shorter than scheduled production time Tp (S27: Yes). On the other hand, cancelling the stopping of loading of board 90 onto reference device Sd may be made contingent on the completion of the maintenance or the like, in the expectation that the maintenance will be executed beyond scheduled required time Tr.

3-3. Other

In the embodiment, time calculation section 83 deducts elapsed time Te and scheduled production time Tp from time limit Tm to calculate stop permissible time Ts. On the other hand, time limit Tm may be a fixed value corresponding to the position of the production device in production line 1, for example.

In the embodiment, manufacturing management device 80 is incorporated in host PC 70. On the other hand, manufacturing management device 80 may be an external device of host PC 70. For example, manufacturing management device 80 may be incorporated into each of the production devices and coordinate with adjacent production devices by sequential notification regarding permission or denial of conveyance, for example. Further, manufacturing management device 80 may be a dedicated device communicably connected to component mounter 5 and host PC 70.

REFERENCE SIGNS LIST

1: production line, 2: printer, 3: print inspection device, 4: buffer device, 5: component mounter, 6: appearance inspection device, 7: reflow furnace, 8: function inspection device, 10: board conveyance device, 20: component supply device, 30: component transfer device, 33: mounting head, 50: control device, 51: display device, 52: input device, 70: host computer (host PC), 80: manufacturing management device, 81: determination section, 82: conveyance management section, 83: time calculation section, 84: level setting section, 90: board (circuit board), M1: maintenance information, M2: operator information, M3: maintenance plan, Sd: reference device, Rd: maintenance target device, Lm: maintenance level, Lt: threshold, Tm: time limit, Te: elapsed time (since unloading by reference device), Tp: scheduled production time, Ts: stop permissible time, Tr: required time for maintenance, Tn: time elapsed since start of maintenance, Tt: remaining maintenance time

The invention claimed is:

1. A manufacturing management device, which is applied to a production line configured by installing multiple production devices each including a component mounter configured to mount an electronic component on a circuit board in a conveyance direction of the circuit board, comprising: processing circuitry configured to determine whether maintenance is necessary on any of the multiple production devices during production by the production line; stop loading circuit boards, at a predetermined time, onto a reference device among the multiple production devices when it is determined that the maintenance is necessary, the reference device being positioned upstream in the production line from a maintenance target device having a cause for maintenance, wherein a stop permissible time is defined as a time during which a production process can be stopped with the circuit board being held in the maintenance target device, and the stop permissible time is obtained by deducting an elapsed time and a scheduled production time from a time limit, and permit conveyance of the circuit board loaded on the reference device at a time, when loading of the circuit board onto the reference device is stopped in a case where a maintenance level is lower than a preset threshold and the stop permissible time is shorter than a required time for the maintenance.

2. The manufacturing management device of claim 1, wherein, in a case where a maintenance level is higher than a preset threshold, the processing circuitry stops loading the circuit board onto the reference device and stops conveying the circuit board in production devices positioned between the reference device and the maintenance target device.

3. The manufacturing management device of claim 1, wherein a maintenance plan indicating an execution time of the maintenance is set in advance in at least some of the multiple production devices;
wherein the processing circuitry determines whether the maintenance on any of the multiple production devices is necessary based on the maintenance plan; and
wherein the processing circuitry, in a case in which the maintenance is determined to be necessary based on the maintenance plan, stops loading the circuit board onto the reference device at a time in accordance with the maintenance plan.

4. The manufacturing management device of claim 1, wherein the reference device is the production device positioned at the head of the production line.

5. The manufacturing management device of claim 1, wherein the reference device is the production device in which the time limit is set from a time when the circuit board is unloaded to a time until the circuit board passes through component mounters positioned downstream in the production line.

6. The manufacturing management device of claim 5, wherein
the elapsed time being a time from unloading of the circuit board from the reference device until loading of the circuit board onto the maintenance target device, while the scheduled production time being a time required for the circuit board to pass through all the component mounters positioned downstream in the production line from the maintenance target device.

7. The manufacturing management device of claim 6, wherein a difference between the required time for the maintenance and a time elapsed since a start of the maintenance on the maintenance target device is defined as a remaining maintenance time indicating a necessary time until completion of the maintenance; and
wherein in a case where the remaining maintenance time of the maintenance is shorter than the scheduled production time of passing through from the reference device to an immediately preceding production device of the maintenance target device, the processing circuitry cancels the stopping of loading of the circuit board onto the reference device and restarts execution of the production process.

8. The manufacturing management device of claim 6, wherein in a case where the maintenance level is lower than the preset threshold and the stop permissible time is longer than the required time for maintenance, the processing circuitry stops conveyance of the circuit board in production devices positioned between the reference device and the maintenance target device.

9. The manufacturing management device of any one of claim 6, wherein the processing circuitry is configured to calculate the required time for the maintenance based on a type of the maintenance.

10. The manufacturing management device of claim 9, wherein a calculated required time for the maintenance is displayed for an operator who performs the maintenance, and an edit of the required time for the maintenance by the operator is received.

11. The manufacturing management device of claim 9, wherein the processing circuitry adjusts the required time for maintenance in accordance with a technical level or work performance of the operator who performs the maintenance at a time when maintenance is determined to be necessary.

12. The manufacturing management device of claim 6, wherein the time limit set for the circuit board is set based on at least one of a type of board product produced in the production line, a production environment in the production line, and a type of a bonding material configured to bond the circuit board and the electronic component.

13. The manufacturing management device of claim 12, wherein the reference device is a printer configured to print solder as bonding material on the circuit board, and the time limit is set as a time during which viscosity of the solder is maintained at a regulated value or higher from completion of a printing process by the printer.

14. The manufacturing management device of claim 1, wherein the component mounter of at least one of the production devices further includes: a board conveyance device configured to convey the circuit board; a component supply device configured to supply the electronic component, and a mounting head configured to pick up the electronic component supplied by the component supply device and to mount the electronic component on an upper surface of the circuit board; wherein the mounting head is allowed, by the manufacturing management device, to execute a regulated operation in parallel with the conveyance of the circuit board by the board conveyance device; and wherein the processing circuitry determines whether maintenance on the mounting head is necessary based on quality of the regulated operation.

15. The manufacturing management device of claim 14, wherein the processing circuitry is configured to set a maintenance level in accordance with a degree quality of the regulated operation in a case where maintenance of the mounting head is determined to be necessary.

16. The manufacturing management device of claim 1, application Ser. No. 16/476,964 Reply to Office Action of Sep. 16, 2020 wherein the production line includes a camera configured to perform an appearance inspection on the electronic component, as an Inspection target, the electronic component being mounted on the circuit board by a component mounter upstream; and wherein the processing circuitry determines whether maintenance is necessary based on an appearance inspection result.

17. The manufacturing management device of claim 16, wherein the Processing circuitry is configured to set a maintenance level in accordance with a degree of the appearance inspection result in a case where maintenance is determined to be necessary.

* * * * *